(12) United States Patent
Kawaguchi et al.

(10) Patent No.: US 7,792,169 B2
(45) Date of Patent: Sep. 7, 2010

(54) NITRIDE SEMICONDUCTOR LIGHT EMITTING DEVICE

(75) Inventors: Yoshinobu Kawaguchi, Mihara (JP); Takeshi Kamikawa, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 531 days.

(21) Appl. No.: 11/713,760

(22) Filed: Mar. 5, 2007

(65) Prior Publication Data
US 2007/0210324 A1    Sep. 13, 2007

(30) Foreign Application Priority Data
Mar. 8, 2006 (JP) .............. 2006-062636
Jan. 29, 2007 (JP) .............. 2007-017547

(51) Int. Cl.
*H01S 3/04* (2006.01)
(52) U.S. Cl. .............. 372/43.01; 257/96; 372/49.01
(58) Field of Classification Search ........... 257/96; 372/49.01, 43.01
See application file for complete search history.

(56) References Cited

U.S. PATENT DOCUMENTS

| 5,196,958 | A | 3/1993 | Verbeek et al. |
| 5,231,062 | A | 7/1993 | Mathers et al. |
| 5,741,724 | A | 4/1998 | Ramdani et al. |
| 5,777,792 | A | 7/1998 | Okada et al. |
| 6,370,177 | B1 | 4/2002 | Genei et al. |
| 6,667,187 | B2 | 12/2003 | Genei et al. |
| 7,356,060 | B2 * | 4/2008 | Mochida .............. 372/43.01 |
| 2002/0024981 | A1 | 2/2002 | Tojo et al. |
| 2003/0015715 | A1 | 1/2003 | Sakai |
| 2003/0048823 | A1 | 3/2003 | Yamanaka |
| 2003/0210722 | A1 | 11/2003 | Arakida et al. |
| 2004/0026710 | A1 | 2/2004 | Tsuda et al. |
| 2004/0165635 | A1 | 8/2004 | Sugimoto et al. |
| 2004/0190576 | A1 | 9/2004 | Matsuoka et al. |
| 2004/0213314 | A1 | 10/2004 | Kunitsugu et al. |
| 2004/0238810 | A1 | 12/2004 | Dwilinski et al. |
| 2004/0245535 | A1 | 12/2004 | D'Evelyn et al. |
| 2005/0104162 | A1 | 5/2005 | Xu et al. |
| 2005/0127383 | A1 * | 6/2005 | Kikawa et al. .............. 257/98 |

(Continued)

FOREIGN PATENT DOCUMENTS

JP          03-049281          3/1991

(Continued)

OTHER PUBLICATIONS

Office Action for related U.S. Appl. No. 11/638,581 dated Oct. 21, 2008.

(Continued)

*Primary Examiner*—David Vu
*Assistant Examiner*—Brandon Fox
(74) *Attorney, Agent, or Firm*—Harness, Dickey & Pierce, P.L.C.

(57) ABSTRACT

A nitride semiconductor light emitting device includes a first coat film of aluminum nitride or aluminum oxynitride formed at a light emitting portion and a second coat film of aluminum oxide formed on the first coat film. The thickness of the second coat film is at least 80 nm and at most 1000 nm. Here, the thickness of the first coat film is preferably at least 6 nm and at most 200 nm.

7 Claims, 8 Drawing Sheets

U.S. PATENT DOCUMENTS

| | | |
|---|---|---|
| 2005/0281304 A1 | 12/2005 | Mochida |
| 2006/0093005 A1 | 5/2006 | Okunuki et al. |
| 2006/0133442 A1 | 6/2006 | Kondou et al. |
| 2007/0138491 A1 | 6/2007 | Kawaguchi et al. |
| 2007/0205424 A1 | 9/2007 | Kamikawa et al. |
| 2007/0246720 A1 | 10/2007 | Kamikawa et al. |

FOREIGN PATENT DOCUMENTS

| | | | |
|---|---|---|---|
| JP | 03-209895 | | 9/1991 |
| JP | 09-162496 | | 6/1997 |
| JP | 09162496 A | * | 6/1997 |
| JP | 09-194204 | | 7/1997 |
| JP | 09-283843 | | 10/1997 |
| JP | 2743106 | | 2/1998 |
| JP | 2002-100830 | | 4/2002 |
| JP | 2002100830 A | * | 4/2002 |
| JP | 2002-237648 | | 8/2002 |
| JP | 2002-335053 | | 11/2002 |
| JP | 2005-175111 A | | 6/2005 |
| JP | 2005-340625 | | 12/2005 |

OTHER PUBLICATIONS

Advisory Action for related U.S. Appl. No. 11/713,761 dated Dec. 30, 2008.
Office Action for related U.S. Appl. No. 11/638,582 dated Oct. 20, 2008.
Office Action for related U.S. Appl. No. 11/785,981 dated Dec. 30, 2008.
Office Action for related U.S. Appl. No. 12/010,028 dated Mar. 20, 2009.
Office Action for related U.S. Appl. No. 11/638,581 dated Mar. 23, 2009.
Office Action for related U.S. Appl. No. 11/713,761 dated Apr. 6, 2009.
Office Action for co-pending U.S. Appl. No. 11/638,581 dated Apr. 9, 2008.
Office Action dated Jun. 4, 2009 from copending U.S. Appl. No. 11/785,981.
Advisory Action dated Aug. 3, 2009 in connection with U.S. Appl. No. 11/638,581.
Office Action for related U.S. Appl. No. 11/638,582 dated Jun. 12, 2008.
Office Action for U.S. Appl. No. 11/785,981 dated Jun. 26, 2008.
Advisory Action for U.S. Appl. No. 11/638,581 dated Jul. 10, 2008.
Office Action for related U.S. Appl. No. 11/713,761 dated Sep. 4, 2008.
Office Action dated Dec. 14, 2009 from copending U.S. Appl. No. 11/785,981.
Advisory Action dated Jan. 12, 2010 from copending U.S. Appl. No. 11/713,761.
Office Action dated Mar. 16, 2010 from copending U.S. Appl. No. 11/713,761.
Advisory Action dated Mar. 23, 2010 from copending U.S. Appl. No. 11/785,981.
Office Action dated Feb. 26, 2010 from co-pending U.S. Appl. No. 11/638,581.
Office Action dated Jan. 25, 2010 from copending U.S. Appl. No. 12/153,756.
Office Action dated Jan. 26, 2010 from copending U.S. Appl. No. 11/638,582.
Office Action dated Aug. 3, 2009 from copending U.S. Appl. No. 11/638,582.
Office Action dated Sep. 22, 2009 from copending U.S. Appl. No. 11/713,761.
Office Action dated Oct. 15, 2009 from copending U.S. Appl. No. 11/638,581.
Office Action dated Oct. 15, 2009 from copending U.S. Appl. No. 12/314,402.
Advisory Action dated Apr. 21, 2010 from copending U.S. Appl. No. 11/638,582.
Office Action dated May 24, 2010 from copending U.S. Appl. No. 11/638,581.
Office Action dated May 26, 2010 from copending U.S. Appl. No. 12/382,530.
Office Action dated May 26, 2010 from copending U.S. Appl. No. 12/314,402.
Office Action dated Jun. 17, 2010 from copending U.S. Appl. No. 12/153,756.
Dreer, et al. "*Statistical evaluation of refractive index, growth rate, hardness and Young's modulus of aluminium oxynitride fims*", Thin Solid Films, vol. 354, pp. 43-49, 1999.
Hartnett, et al. "*Optical properties of ALON (aluminum oxynitride)*", Infrared Physics & Technology, vol. 39, pp. 203-211, 1998.

* cited by examiner

NITRIDE SEMICONDUCTOR LIGHT EMITTING DEVICE

This nonprovisional application is based on Japanese Patent Application Nos. 2006-062636 and 2007-017547 filed with the Japan Patent Office on Mar. 8, 2006 and Jan. 29, 2007, the entire contents of which are hereby incorporated by reference.

BACKGROUND OF THE INVENTION

1. Field of the Invention

The present invention relates to a nitride semiconductor light emitting device and more particularly to a nitride semiconductor light emitting device with improved reliability at the time of high power drive.

2. Description of the Background Art

Among semiconductor light emitting devices, semiconductor laser devices are used as light sources for reading and writing of a signal of an optical recording medium such as CD (Compact Disk), DVD (Digital Versatile Disk) or Blue-Ray Disk. When a semiconductor laser device is used as a light source for writing, a higher-power semiconductor laser device is required because of increased speed and increased capacity of multi-layering media. Therefore, nitride semiconductor laser devices adapted to high power, for each wavelength of infrared, red, blue or the like, have been developed and are still now under development.

Recently, research and development has been conducted in an attempt to use a semiconductor laser device as an excitation light source for phosphors, other than a light source for reading and writing of a signal of an optical recording medium, and to use a semiconductor laser device as illumination. Even in the case where a semiconductor laser device is used as illumination, a higher-power semiconductor laser device is important to achieve higher efficiency and higher power of a semiconductor laser device.

Poor reliability resulting from degradation of a light emitting portion on a facet at the light emitting side is known as a big problem in achieving higher power of a semiconductor laser device. This is commonly known as COD (Catastrophic Optical Damage) which is a phenomenon in which the light emitting portion is thermally melted thereby causing emission stop. The optical power at which COD occurs is referred to as a COD level. The reason why COD occurs is that the light emitting portion becomes an absorption region in which laser light is absorbed. It is said that non-radiative recombination level is attributable to the absorption region.

In order to improve the COD level, generally, a window structure is formed by widening a bandgap of a light emitting portion for transmitting laser light, or a facet at the light emitting side is coated with a dielectric film for protection (see, for example, Japanese Patent Laying-Open Nos. 2002-237648 and 2002-335053).

SUMMARY OF THE INVENTION

FIG. 13 shows the relation between aging time and driving current when an aging test is conducted in which a conventional nitride semiconductor laser device is CW (Continuous Wave) driven in a temperature environment of 70° C. to continuously emit high-power laser light with an optical power of 100 mW. Here, after the aging time of a few tens of hours passed, a driving current value becomes 0, which indicates that laser light emission stops at that time point.

The light emitting portion of the nitride semiconductor laser device in which laser light emission stops is found to have a hole which may be created as the light emitting portion is melted, and it is understood that the degradation of the light emitting portion causes emission stop. A coat film made of aluminum (Al) nitride is formed at a thickness of 50 nm on the facet at the light emitting side of the conventional nitride semiconductor laser device.

The problem of reduced reliability due to degradation of the light emitting portion at the time of high power drive is not exclusive to nitride semiconductor laser devices but is common to nitride semiconductor light emitting diode devices.

An object of the present invention is therefore to provide a nitride semiconductor light emitting device with improved reliability at the time of high power drive.

The present invention provides a nitride semiconductor light emitting device including a first coat film of aluminum nitride or aluminum oxynitride formed at a light emitting portion and a second coat film of aluminum oxide formed on the first coat film. The second coat film has a thickness of at least 80 nm and at most 1000 nm.

Preferably, in the nitride semiconductor light emitting device according to the present invention, a thickness of the first coat film is at least 6 nm and at most 200 nm.

Preferably, in the nitride semiconductor light emitting device according to the present invention, a thickness of the first coat film is at least 12 nm and at most 200 nm.

Preferably, in the nitride semiconductor light emitting device according to the present invention, a thickness of the first coat film is at least 50 nm and at most 200 nm.

More preferably, in the nitride semiconductor light emitting device according to the present invention, a thickness of the second coat film is at least 130 nm and at most 1000 nm.

More preferably, in the nitride semiconductor light emitting device according to the present invention, a thickness of the second coat film is at least 150 nm and at most 100 nm.

Most preferably, in the nitride semiconductor light emitting device according to the present invention, a thickness of the second coat film is at least 160 nm and at most 1000 nm.

Preferably, in the nitride semiconductor light emitting device according to the present invention, the first coat film is made of aluminum oxynitride, and the first coat film has an oxygen content of at most 20 atomic %.

In accordance with the present invention, it is possible to provide a nitride semiconductor light emitting device with improved reliability at the time of high power drive.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
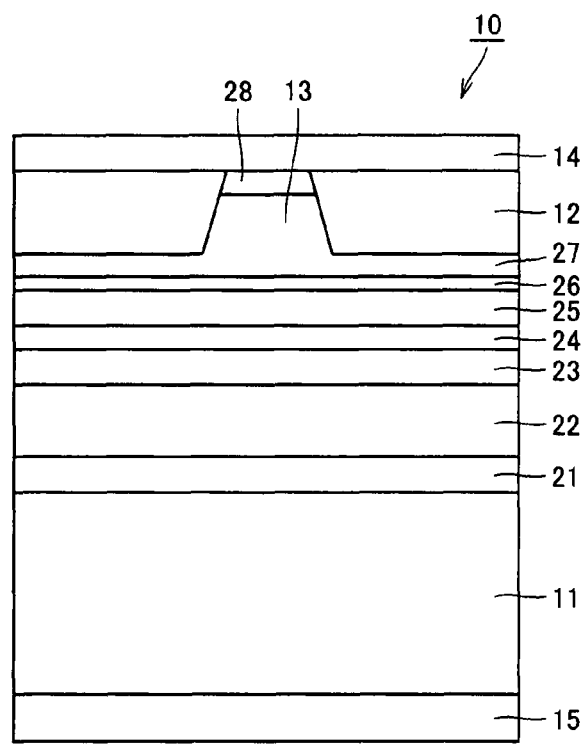
FIG. 1 is a cross section schematically showing a nitride semiconductor laser device in accordance with a first embodiment of the present invention.

In the following, embodiments of the present invention will be described. It is noted that the same reference characters represent the same or corresponding parts in the drawings of the present invention.

As a result of elaborate study, the inventor has found that reliability at the time of high power drive of a nitride semiconductor light emitting device can be improved enough by forming a first coat film made of aluminum nitride or aluminum oxynitride on a light emitting portion of the nitride semiconductor light emitting device and forming a second coat film made of aluminum oxide on the first coat film with a thickness of 80 nm or thicker. The present invention has thus been completed.

The inventor has also found that if the thickness of the second coat film is 130 nm or thicker, the reliability at the time of high power drive of the nitride semiconductor light emitting device can be improved more.

The inventor has also found that if the thickness of the second coat film is 150 nm or thicker, the reliability at the time of high power drive of the nitride semiconductor light emitting device can be improved further.

The inventor has also found that if the thickness of the second coat film is 160 nm or thicker, the reliability at the time of high power drive of the nitride semiconductor light emitting device can be particularly improved.

In addition, as a result of elaborate study, the inventor has found that reliability at the time of high power drive of the nitride semiconductor light emitting device tends to be improved as the thickness of the first coat film made of aluminum nitride or aluminum oxynitride is set to 6 nm or thicker, 12 nm or thicker, 50 nm or thicker. Therefore, the thickness of the first coat film made of aluminum nitride or aluminum oxynitride is preferably 6 nm or thicker, more preferably 12 nm or thicker, and even more preferably 50 nm or thicker.

If the first coat film is too thick, the first coat film easily peels off. Therefore, the thickness of the first coat film is preferably 200 nm or thinner. On the other hand, even if the second film is thick, the second film does not easily peel off. However, in view of productivity, the thickness of the second coat film is set to 1000 nm or thinner.

In the case where the first coat film is made of aluminum oxynitride, if the oxygen content of the first coat film is higher than 20 atomic % of the total atoms that constitute the first coat film, in effect, similarly to the case where a film made of aluminum oxide is directly formed at the light emitting portion of the nitride semiconductor light emitting device, the reliability at the time of high power drive cannot be improved enough. Accordingly, the oxygen content of the first coat film made of aluminum oxynitride is preferably 20 atomic % or lower of the total atoms that constitute the first coat film.

Here, the nitride semiconductor light emitting device of the present invention includes, for example, a nitride semiconductor laser device, a nitride semiconductor light emitting diode device, or the like. Further, the nitride semiconductor light emitting device of the present invention means a semiconductor light emitting device including an active layer and a cladding layer formed on a substrate which are formed of a material including 50 mass % or more of a compound made of a group 3 element of at least one kind selected from the group consisting of aluminum, indium and gallium, and nitrogen as a group 5 element.

First Embodiment

FIG. 1 is a cross section schematically showing a nitride semiconductor laser device in the present embodiment. Here, a nitride semiconductor laser device 10 in the present embodiment is configured to include a buffer layer 21 having a thickness of 0.2 μm made of n-type GaN, an n-type cladding layer 22 having a thickness of 2.3 μm made of n-type $Al_{0.06}Ga_{0.94}N$, an n-type guide layer 23 having a thickness of 0.02 μm made of n-type GaN, a multiple quantum well active layer 24 made of 4 nm-thick InGaN and 8 nm-thick GaN, a protective layer 25 having a thickness of 70 nm made of GaN, a p-type current block layer 26 having a thickness of 20 nm made of p-type $Al_{0.3}Ga_{0.7}N$, a p-type cladding layer 27 having a thickness of 0.5 μm made of p-type $Al_{0.05}Ga_{0.95}N$, and a p-type contact layer 28 having a thickness of 0.1 μm made of p-type GaN, which are stacked on a semiconductor substrate 11 made of n-type GaN in this order from semiconductor substrate 11. Here, the thickness and mixed crystal ratio in each of the above-noted layers is adjusted as appropriate and is irrelevant to the essence of the present invention. The wavelength of laser light emitted from nitride semiconductor laser device 10 in the present embodiment is adjusted, for example, in the range of 370 nm-470 nm as appropriate according to the mixed crystal ratio of multiple quantum well active layer 24. In the present embodiment, the wavelength of emitted laser light is adjusted to 405 nm. Multiple quantum well active layer 24 may also include at least one kind of group 5 elements such as As or P by at least 0.01 atomic % and at most 10 atomic %.

Nitride semiconductor laser device 10 in the present embodiment is formed in such a manner that p-type cladding layer 27 and p-type contact layer 28 are partially removed so that a stripe-like ridge stripe portion 13 extends in the cavity length direction. Here, the width of the stripe of ridge stripe portion 13 is, for example, about 1.2-2.4 μm, typically about 1.5 μm. The present invention is also applicable to a broad area type nitride semiconductor laser device for use in illumination with the stripe width of a few tens of μm. In addition, a p-electrode 14 made of a multilayer of a Mo layer and an Au layer is provided on a surface of p-type contact layer 28. An insulating film 12 made of a multilayer of an $SiO_2$ layer and a $TiO_2$ layer is provided under p-electrode 14 at a part excluding the part where ridge stripe portion 13 is formed. In addition, an n-electrode 15 made of a multilayer of an Hf layer and an Al layer is formed on the surface of semiconductor substrate 11 that is opposite to the side where the above-noted nitride semiconductor layers are stacked.

Figure 2:
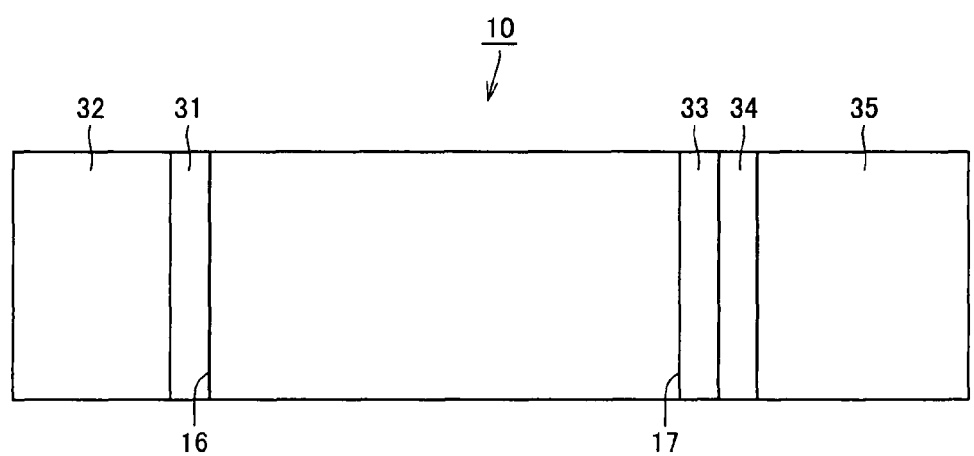
FIG. 2 is a side view schematically showing the nitride semiconductor laser device in the first embodiment of the present invention shown in FIG. 1 in the cavity length direction.

FIG. 2 is a side view schematically showing the nitride semiconductor laser device in the present embodiment shown in FIG. 1 in the cavity length direction. Here, a facet 17 at the light reflecting side and a facet 16 at the light emitting side serving as a light emitting portion of nitride semiconductor laser device 10 in the present embodiment can be formed, for example, as follows: a wafer formed by stacking the aforementioned nitride semiconductor layers such as a buffer layer in order on the aforementioned semiconductor substrate, forming a ridge stripe portion, and thereafter forming an insulating film, a p-electrode and an n-electrode is cleaved by such technique as scribing and breaking using a diamond point. The cleavage surfaces formed by this cleavage are facet 16 and facet 17 parallel to each other as shown in FIG. 2.

Then, an aluminum oxynitride film 31 having a thickness of 6 nm is formed as a first coat film on facet 16 at the light emitting side, and an aluminum oxide film 32 having a thickness of 80 nm is formed as a second coat film on aluminum oxynitride film 31, with reflectivity of 7%.

On the other hand, an aluminum oxynitride film 33 having a thickness of 6 nm is formed on facet 17 at the light reflecting side. An aluminum oxide film 34 having a thickness of 80 nm is formed on aluminum oxynitride film 33. A high reflection film 35 with reflectivity of 95% or higher is formed on aluminum oxide film 34 by stacking four pairs of a 71 nm-thick silicon oxide film and a 46 nm-thick titanium oxide film (stacked starting from the silicon oxide film) and thereafter forming a silicon oxide film having a thickness of 142 nm on the outermost surface.

Each of the aforementioned aluminum oxynitride film 31, aluminum oxide film 32, aluminum oxynitride film 33, aluminum oxide film 34, and high reflection film 35 may be formed for example by ECR (Electron Cyclotron Resonance) sputtering as described below, or may be formed by any other sputtering, EB (Electron Beam) evaporation, CVD (Chemical Vapor Deposition), or the like.

Figure 3:
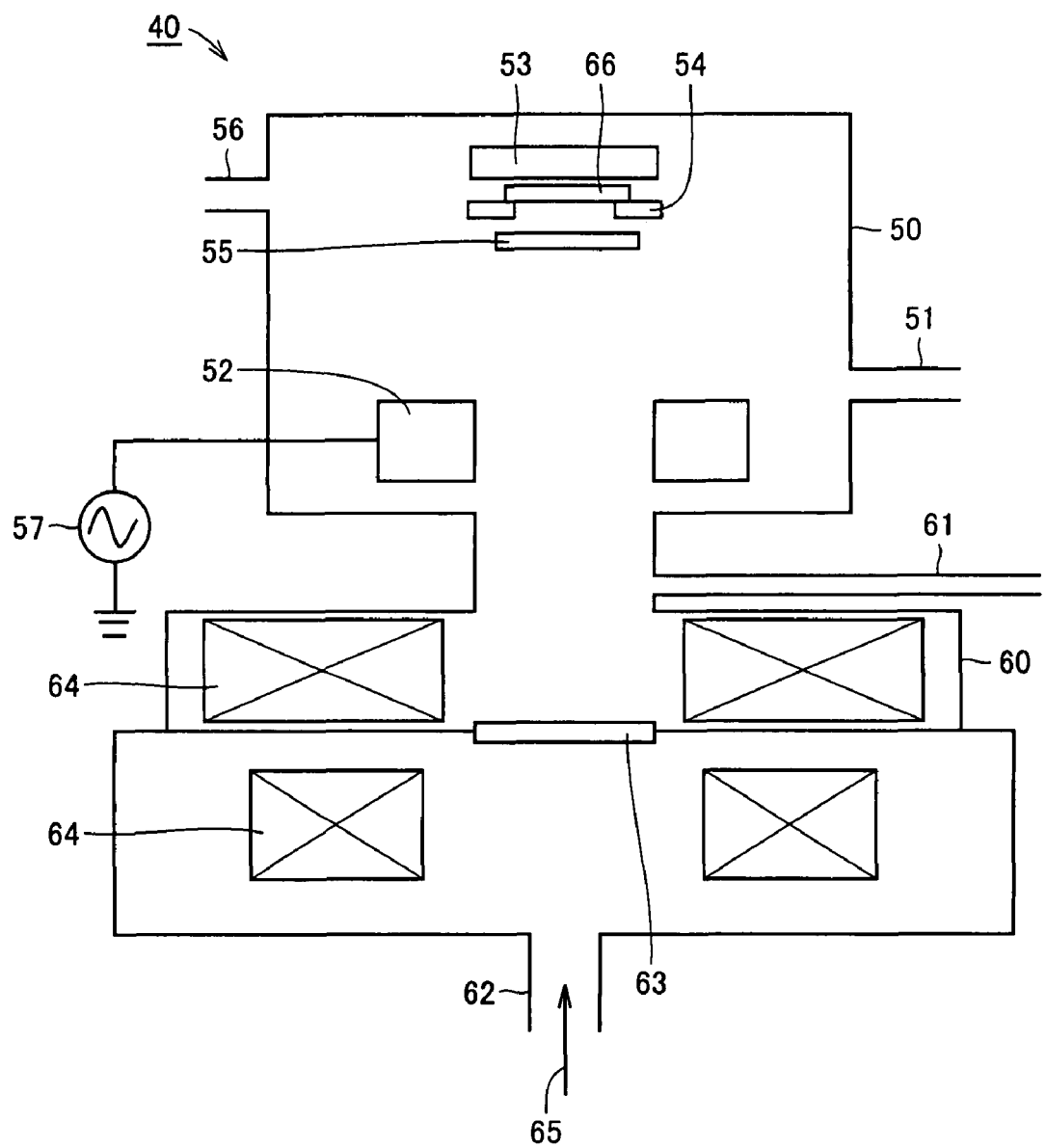
FIG. 3 schematically shows a configuration of an exemplary ECR sputtering apparatus.

FIG. 3 schematically shows a configuration of an exemplary ECR sputtering apparatus. Here, an ECR sputtering apparatus 40 is mainly formed of a deposition furnace 50 and a plasma generation room 60. Deposition furnace 50 is provided with a gas inlet 51 and a gas outlet 56. A target 52, a heater 53 for heating, a sample stage 54, and a shutter 55 are installed in deposition furnace 50. A sample 66 after cleavage as described above is placed on sample stage 54. Here, sample 66 is attached to a holder (not shown) in such a direction that allows a film to be deposited on facet 16 or facet 17. A vacuum pump (not shown) is also attached to gas outlet 56 to allow gas in deposition furnace 50 to be discharged therefrom. An RF power supply 57 is additionally connected to target 52.

Furthermore, plasma generation room 60 is provided with a gas inlet 61 and a microwave introduction port 62. A microwave introduction window 63 and a magnetic coil 64 are installed in plasma generation room 60. Then, a microwave 65 introduced from microwave introduction port 62 is introduced through microwave introduction window 63, so that plasma is generated from the gas introduced from gas inlet 61.

Using ECR sputtering apparatus 40 having such a configuration, as shown in FIG. 2, aluminum oxynitride film 31 having a thickness of 6 nm is first formed on facet 16 at the light emitting side and then aluminum oxide film 32 having a thickness of 80 nm is successively formed on aluminum oxynitride film 31.

Specifically, first, nitrogen gas is introduced into deposition furnace 50 at a flow rate of 5.5 sccm, oxygen gas is introduced at a flow rate of 1.5 sccm, and argon gas is introduced at a flow rate of 20.0 sccm in order to efficiently generate plasma to increase the deposition rate. Then, RF power of 500 W is applied to target 52 for sputtering target 52 made of aluminum and 500 W of microwave power necessary for generating plasma is applied. Then, aluminum oxynitride film 31 having an oxygen content of 20 atomic % with refractive index of 2.1 for light having a wavelength of 405 nm can be formed at a deposition rate of 1.7 Å/second. The respective contents (atomic %) of aluminum, nitrogen and oxygen included in aluminum oxynitride film 31 can be measured for example by AES (Auger Electron Spectroscopy). TEM-EDX (Transmission Electron Microscopy-Energy Dispersive X-ray Spectroscopy) is also available.

Then, introduction of nitrogen gas is stopped, oxygen gas is introduced at a flow rate of 6.6 sccm, and argon gas is introduced at a flow rate of 40.0 sccm. RF power of 500 W is applied to target 52 for sputtering target 52 made of aluminum, and a microwave power of 500 W necessary for generating plasma is applied. Thus, aluminum oxide film 32 can be formed at a deposition rate of 3.0 Å/second.

Before forming aluminum oxynitride film 31, an oxide film or impurity attached on facet 16 is preferably removed for cleaning by heating facet 16, for example, at a temperature of at least 100° C. and at most 500° C. in the deposition apparatus. However, such cleaning may not be performed in the present invention. Alternatively, facet 16 may be cleaned before formation of aluminum oxynitride film 31 by irradiating facet 16 with argon or nitrogen plasma. However, such cleaning may not be performed in the present invention. Plasma radiation may be applied while facet 16 is heated before formation of aluminum oxynitride film 31. As for the plasma radiation as described above, for example, it is also possible to apply argon plasma and thereafter successively apply nitrogen plasma. Plasma, may be applied in the reverse order. Other than argon and nitrogen, for example, such a rare gas as helium, neon, xenon, or krypton may be used. Here, aluminum oxynitride film 31 formed on facet 16 may also be formed while being heated for example at a temperature of at least 100° C. and at most 500° C. However, in the present invention, aluminum oxynitride film 31 may be formed without being heated.

In the present invention, an oxide film formed on aluminum oxynitride film 31 may be formed in a different method from a method of forming the oxynitride film. For example, after aluminum oxynitride film 31 is formed by ECR sputtering, aluminum oxide film 32 may be formed by EB (Electron Beam) evaporation or the like.

Thereafter, after formation of aluminum oxynitride film 31 and aluminum oxide film 32 as described above, aluminum oxynitride film 33, aluminum oxide film 34 and high reflection film 35 are formed in this order on facet 17 at the light reflecting side by the above-noted ECR sputtering or the like.

Preferably, before formation of these films, cleaning by heating and/or cleaning by plasma radiation are also performed.

Here, degradation is significant in the light emitting portion which is a part of the facet at the light emitting side, while degradation is often insignificant in the facet at the light reflecting side where optical density is low as compared with the light emitting side. Therefore, in the present invention, the configuration of a film formed on the facet at the light reflecting side is not limited, and a film may not be formed on the facet at the light reflecting side.

Furthermore, a heating process may be performed after the above-noted films are formed on the facet at the light emitting side and the facet at the light reflecting side. Thus, removal of moisture contained in the above-noted film and improvement in film quality by the heating process can be expected. The heating process may be performed by heating with a heater, ultraviolet laser radiation, or the like.

In this manner, aluminum oxynitride film 31 and aluminum oxide film 32 are formed in order on facet 16 at the light emitting side of the aforementioned sample, and aluminum oxynitride film 33, aluminum oxide film 34 and high reflection film 35 are formed in order on facet 17 at the light reflecting side. The sample is thereafter divided into chips, resulting in a nitride semiconductor laser device.

Figure 4:
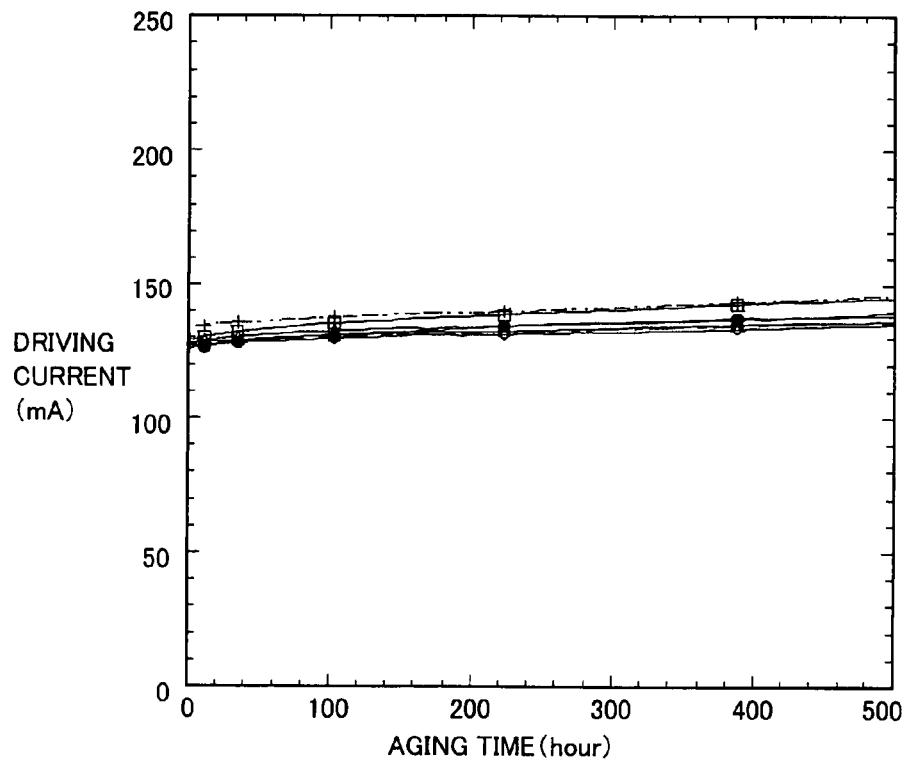
FIG. 4 shows a result of an aging test in high power drive for the nitride semiconductor laser device in the first embodiment.

Now, an aging test was conducted in such a manner that the resultant nitride semiconductor laser device in this embodiment was allowed to continuously emit laser light with an optical power of 100 mW with CW drive in a temperature environment of 70° C. The result is shown in FIG. 4. As shown in FIG. 4, as for the nitride semiconductor laser device of the present embodiment, even after 500 hours passed, all the seven nitride semiconductor laser devices subjected to the aging test were driven without stopping laser light emission.

Figure 5:
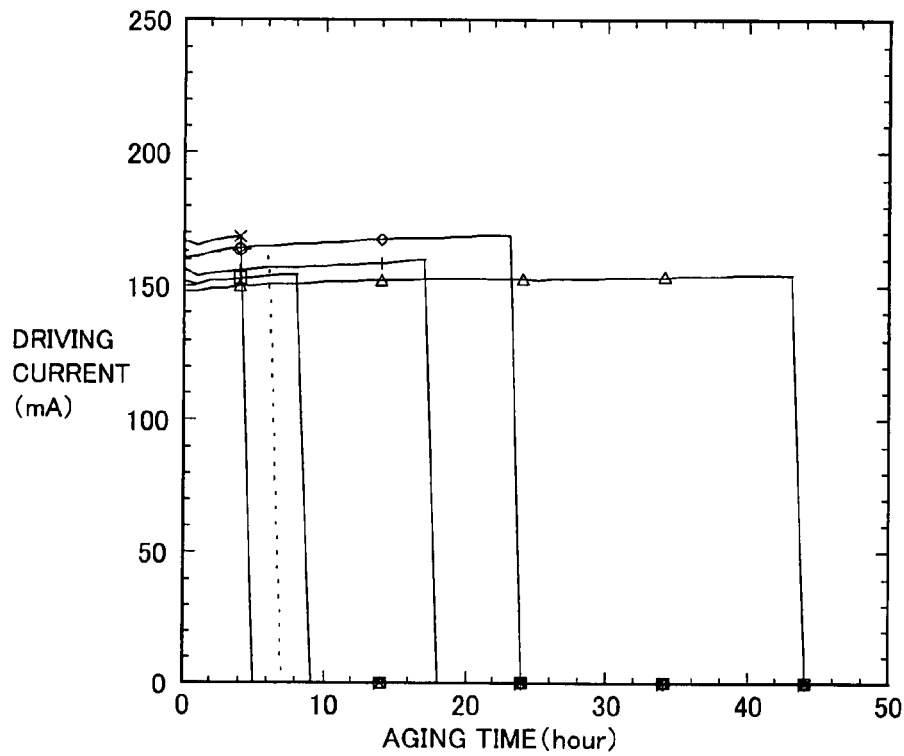
FIG. 5 shows a result of an aging test in high power drive for a nitride semiconductor laser device fabricated for comparison.

For comparison, a nitride semiconductor laser device was fabricated similarly to the present embodiment, except that the respective thicknesses of aluminum oxide film 32 at the light emitting side and aluminum oxide film 34 at the light reflecting side are set at 40 nm. Then, an aging test was conducted for the resultant nitride semiconductor laser device for comparison, similarly to the nitride semiconductor laser device in the present embodiment. The result is shown in FIG. 5. As shown in FIG. 5, for the nitride semiconductor laser device for comparison, all the six nitride semiconductor laser devices subjected to the aging test stopped emission within 60 hours. The facets at the light emitting side of these nitride semiconductor laser devices which stopped emission were found to have holes which seemed to be created by thermal melting.

Figure 6:
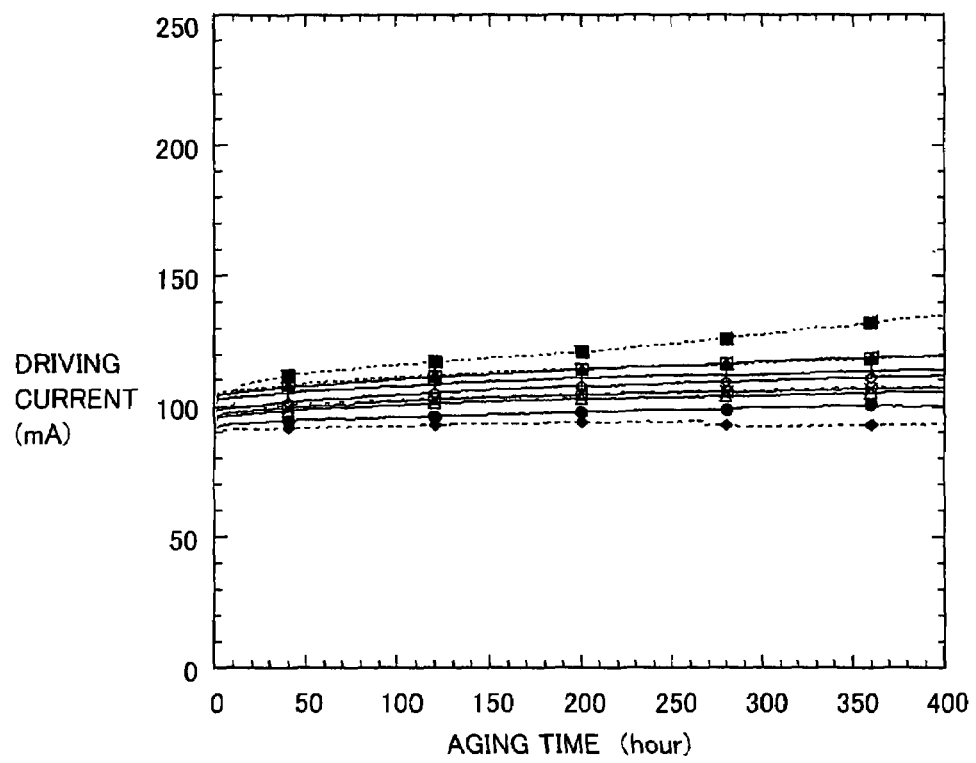
FIG. 6 shows a result of an aging test in low power drive for a nitride semiconductor laser device fabricated for comparison.

In addition, for comparison, a nitride semiconductor laser device was fabricated similarly to the present embodiment, except that the respective thicknesses of aluminum oxynitride film 31 at the light emitting side and aluminum oxynitride film 33 at the light reflecting side are set at 3 nm. Then, an aging test was conducted in such a manner that the resultant nitride semiconductor laser device for comparison was allowed to continuously emit low-power laser light with an optical power of 65 mW with CW drive in a temperature environment of 70° C. The result is shown in FIG. 6. As shown in FIG. 6, for the nitride semiconductor laser device for comparison, all the ten nitride semiconductor laser devices subjected to the aging test were driven normally without stopping emission until 400 hours.

Figure 7:
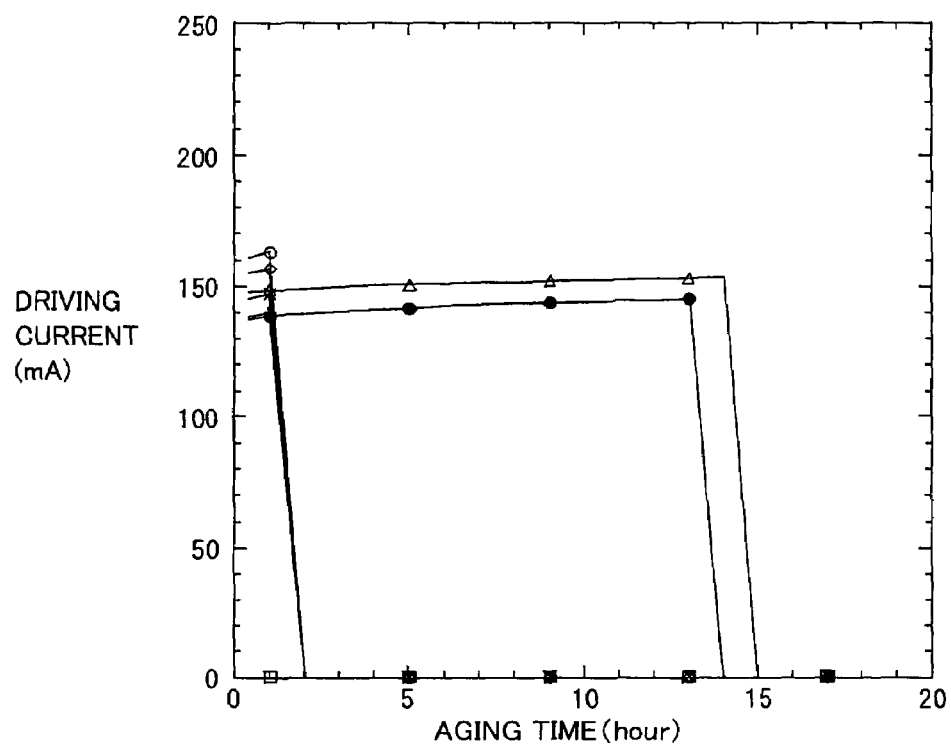
FIG. 7 shows a result of an aging test in high power drive for a nitride semiconductor laser device fabricated for comparison.

However, when an aging test was conducted in such a manner that this nitride semiconductor laser device was allowed to continuously emit high-power laser light with an optical power of 100 mW with CW drive in a temperature environment of 70° C., as shown in FIG. 7, all the seven nitride semiconductor laser devices subjected to the aging test stopped emission within 20 hours. The light emitting portions of these nitride semiconductor laser devices which stopped emission were found to have holes which seemed to be created by thermal melting.

On the other hand, for the nitride semiconductor laser device in the present embodiment, after the aforementioned aging test was conducted for 500 hours, degradation of the light emitting portion was also examined. Here, no degradation was found.

Therefore, it was found that with CW drive and low power with an optical power of about 65 mW, even if the thickness of aluminum oxynitride film 31 at the light emitting side is as thin as 3 nm, sufficient long-term reliability can be achieved, while with CW drive and high power with an optical power of about 100 mW, long-term reliability cannot be achieved.

Here, for the nitride semiconductor laser device for comparison, long-term reliability is achieved in the aging test with CW drive and low power drive with an optical power of 65 mW, because the aluminum oxynitride film may function as an adhesion layer and adhere well to the facet at the light emitting side. However, at the time of high power drive with an optical power of 100 mW with CW drive, it is insufficient that the aluminum oxynitride film merely functions as an adhesion layer.

Based on the foregoing, the thickness of aluminum oxynitride film 31 is set at 6 nm and the thickness of the aluminum oxide film is set at 80 nm, so that the likelihood of poor reliability resulting from degradation of the light emitting portion can be reduced at the time of high power drive, and long-term reliability at the time of high power drive can be improved.

In other words, aluminum oxynitride film 31 and aluminum oxide film 32 formed at the light emitting portion are made thick enough, so that long-term reliability at the time of high power drive can be achieved, which is insufficient when these films are thin.

Now, in order to determine a thickness necessary for achieving long-term reliability at the time of high power drive, an aging test was conducted with varied thicknesses of aluminum oxynitride film 31 and aluminum oxide film 32.

Figure 8:
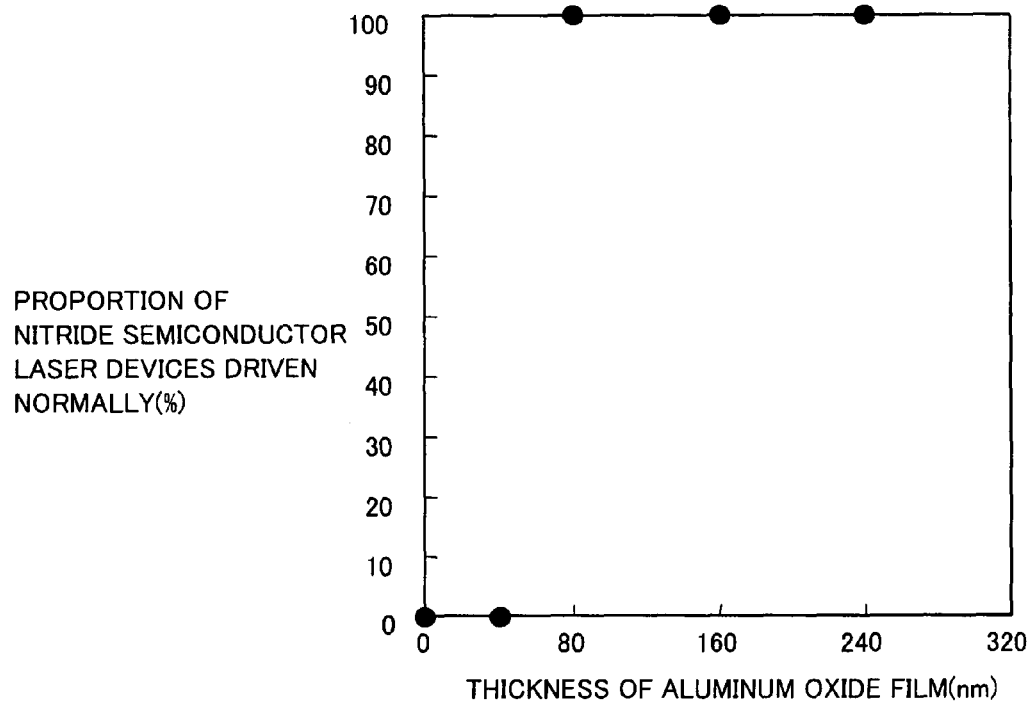
FIG. 8 shows a result of an aging test in high power drive for a nitride semiconductor laser device fabricated to include an aluminum oxynitride film on a facet at the light emitting side with a thickness fixed at 6 nm and an aluminum oxide film formed on the aluminum oxynitride film with varied thicknesses.

FIG. 8 shows the relation between the thickness of aluminum oxide film 32 and the proportion of nitride semiconductor laser devices that were driven normally after 500 hours when they were allowed to continuously emit high-power laser light with an optical power of 100 mW with CW drive in a temperature environment of 70° C., where the thickness of aluminum oxynitride film 31 formed on the facet at the light emitting side of the nitride semiconductor laser device in the present embodiment is fixed at 6 nm and the thickness of aluminum oxide film 32 formed on aluminum oxynitride film 31 is varied.

As shown in FIG. 8, it was found that in the case where the thickness of aluminum oxynitride film 31 on the facet at the light emitting side was 6 nm, if the thickness of aluminum oxide film 32 formed on aluminum oxynitride film 31 was 80 nm or thicker, long-term reliability was achieved even at the time of high power drive.

Next, the COD levels were compared, with the thicknesses of aluminum oxide film 32 set at 80 nm, 160 nm and 240 nm, when high-power laser light with an optical power of 100 mW was continuously emitted for 500 hours with CW drive in a temperature environment of 70° C. As a result, the average COD level of five nitride semiconductor laser devices for each thickness is as follows. When the thickness of aluminum oxide film 32 was 80 nm, the average COD level was 258 mW. When the thickness was 160 nm, the average COD level was 340 mW. When the thickness was 240 nm, the average COD level was 346 mW. Accordingly, it was determined that the thickness of aluminum oxide film 32 was preferably 80 nm or thicker and more preferably 160 nm or thicker.

Figure 9:
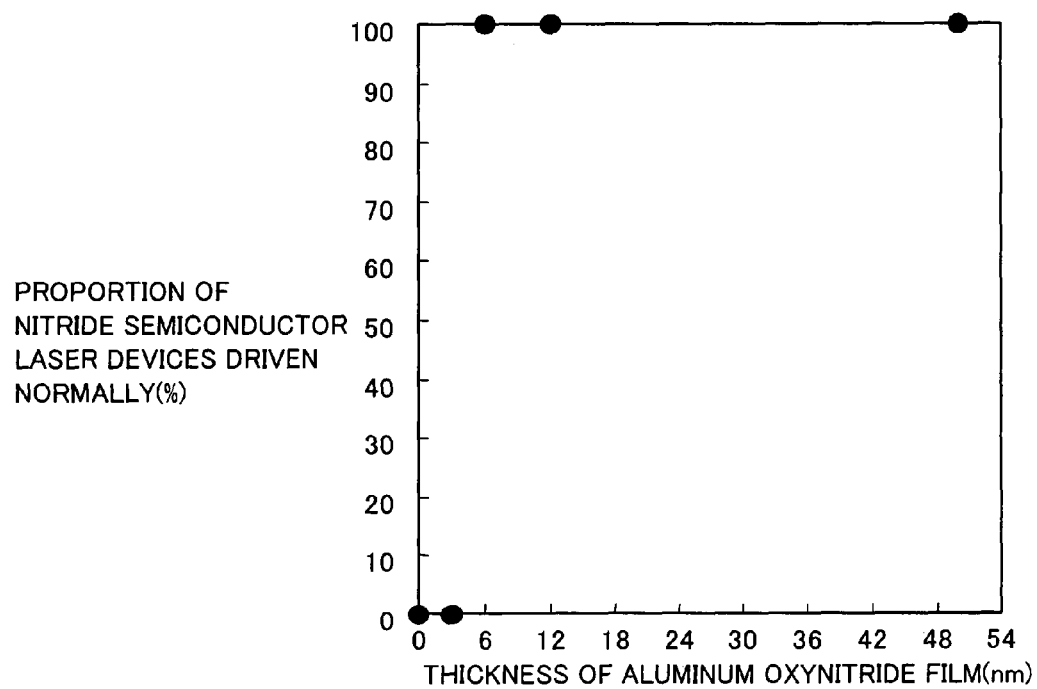
FIG. 9 shows a result of an aging test in high power drive for a nitride semiconductor laser device fabricated to include an aluminum oxynitride film on a facet at the light emitting side with varied thicknesses and an aluminum oxide film formed on the aluminum oxynitride film with a thickness fixed at 80 nm.

Now, FIG. 9 shows the relation between the thickness of aluminum oxynitride film 31 and the proportion of nitride semiconductor laser devices that were driven normally after 500 hours when they were allowed to continuously emit high-power laser light with an optical power of 100 mW with CW drive in a temperature environment of 70° C., where the thickness of aluminum oxynitride film 31 on the facet at the light emitting side of the nitride semiconductor laser device in the present embodiment was varied and the thickness of aluminum oxide film 32 formed on aluminum oxynitride film 31 was fixed at 80 nm.

As shown in FIG. 9, it was found that in the case where the thickness of aluminum oxide film 32 on the facet at the light emitting side was 80 nm, when the thickness of aluminum oxynitride film 31 was set to 6 nm or thicker, long-term reliability was achieved even at the time of high power drive.

Next, the COD levels were compared, with the thicknesses of aluminum oxynitride film 31 set at 6 nm, 12 nm and 50 nm, when high-power laser light with an optical power of 100 mW was continuously emitted for 500 hours with CW drive in a temperature environment of 70° C. As a result, the average COD level of five nitride semiconductor laser devices for each thickness is as follows. When the thickness of aluminum oxynitride film 31 was 6 nm, the average COD level was 258 mW. When the thickness was 12 nm, the average COD level was 356 mW. When the thickness was 50 nm, the average COD level was 487 mW. Accordingly, it was determined that the thickness of aluminum oxynitride film 31 was preferably 6 nm or thicker, more preferably 12 nm or thicker, and even more preferably 50 nm or thicker.

In consideration of the foregoing results, it can be understood that when the thickness of aluminum oxynitride film 31 is 6 nm or thicker and the thickness of aluminum oxide film 32 formed thereon is 80 nm or thicker, long-term reliability can be achieved even at the time of high power drive without degradation of the light emitting portion.

Second Embodiment

A nitride semiconductor laser device in the present embodiment has the similar configuration as the nitride semiconductor laser device in the first embodiment, except that the respective configurations of films formed on the facets at the light emitting side and the light reflecting side are changed and that the wavelength of emitted laser light is set at 410 nm.

Here, in the nitride semiconductor laser device in the present embodiment, respective aluminum nitride films each having a thickness of 6 nm are formed on the facets at the light emitting side and at the light reflecting side, and an aluminum oxide film having a thickness of 80 nm is formed on each of the aluminum nitride films. Here, the reflectivity at the light emitting side is set to 7%. The aluminum nitride film and the aluminum oxide film are formed by ECR sputtering. Specifically, deposition was performed without introducing oxygen gas, which is introduced in the first embodiment to form an aluminum oxynitride film. Besides, the aluminum nitride film may be formed by a variety of sputtering, MBE (Molecular Beam Epitaxy), or the like. On the facet at the light reflecting side, a high reflection film having an identical configuration to that of the first embodiment is formed on the aluminum oxide film.

Figure 10:
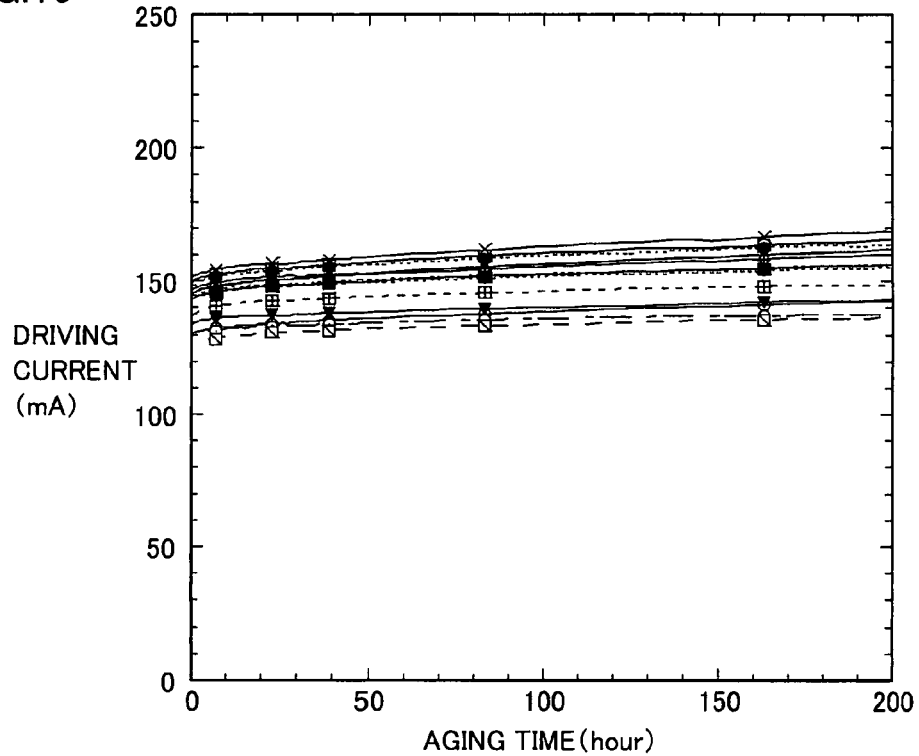
FIG. 10 shows a result of an aging test in high power drive for a nitride semiconductor laser device in accordance with a second embodiment.

For the nitride semiconductor laser device in the present embodiment, an aging test was conducted under the same method and the same conditions as the first embodiment. The result is shown in FIG. 10. As shown in FIG. 10, it was observed that all the fourteen nitride semiconductor laser devices in the present embodiment subjected to the aging test were driven without stopping laser light emission, even after 200 hours passed, and it was found that long-term reliability at the time of high power drive was achieved.

Third Embodiment

A nitride semiconductor laser device in the present embodiment has the similar configuration as the nitride semiconductor laser device in the first embodiment, except that the respective configurations of films formed on the facets at the light emitting side and the light reflecting side are changed and that the wavelength of emitted laser light is set at 400 nm.

Here, in the nitride semiconductor laser device in the present embodiment, respective aluminum oxynitride films each having a thickness of 12 nm are formed on the facets at the light emitting side and at the light reflecting side, and an aluminum oxide film having a thickness of 80 nm is formed on each of the aluminum oxynitride films. Here, the reflectivity at the light emitting side is set to 10%. On the facet at the light reflecting side, a high reflection film having an identical configuration to that of the first embodiment is formed on the aluminum oxide film.

Figure 11:
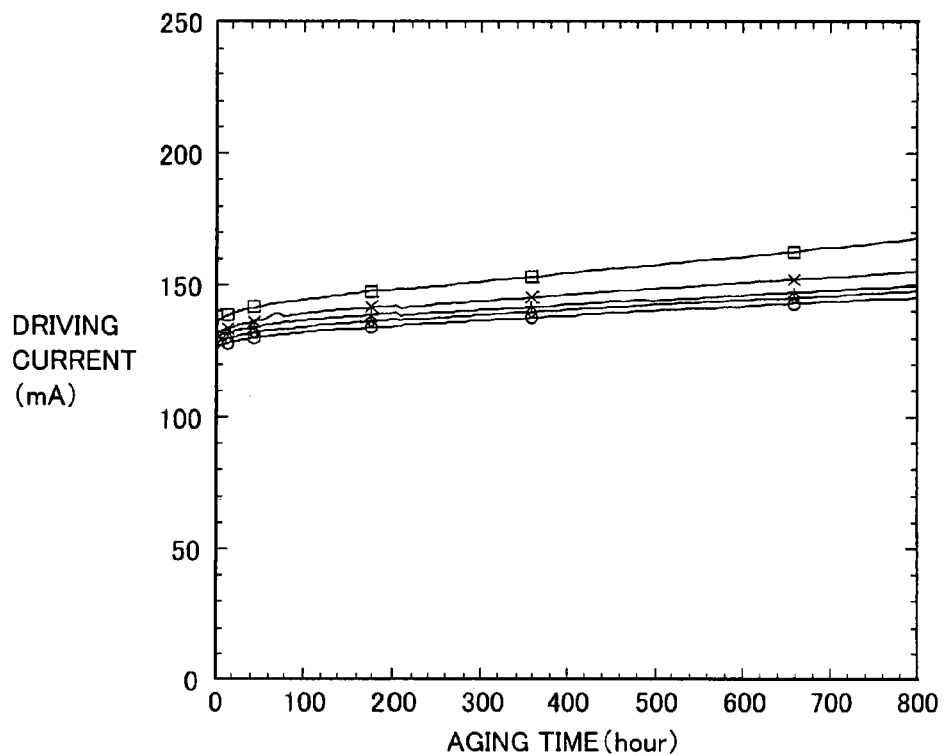
FIG. 11 shows a result of an aging test in high power drive for a nitride semiconductor laser device in accordance with a third embodiment.

For the nitride semiconductor laser device in the present embodiment, an aging test was conducted under the same method and the same conditions as the first embodiment. The result is shown in FIG. 11. As shown in FIG. 11, it was observed that all the five nitride semiconductor laser devices in the present embodiment subjected to the aging test were driven without stopping laser light emission, even after 800 hours passed, and it was found that long-term reliability at the time of high power drive was achieved.

Fourth Embodiment

A nitride semiconductor laser device in the present embodiment has the similar configuration as the nitride semiconductor laser device in the first embodiment, except that the respective configurations of films formed on the facets at the light emitting side and the light reflecting side are changed and that the wavelength of emitted laser light is set at 390 nm.

Here, in the nitride semiconductor laser device in the present embodiment, respective aluminum oxynitride films each having a thickness of 50 nm are formed on the facets at the light emitting side and at the light reflecting side, and an aluminum oxide film having a thickness of 160 nm is formed on each of the aluminum oxynitride films. Here, the reflectivity at the light emitting side is 6%. On the facet at the light reflecting side, a high reflection film having an identical configuration to that of the first embodiment is formed on the aluminum oxide film.

Figure 12:
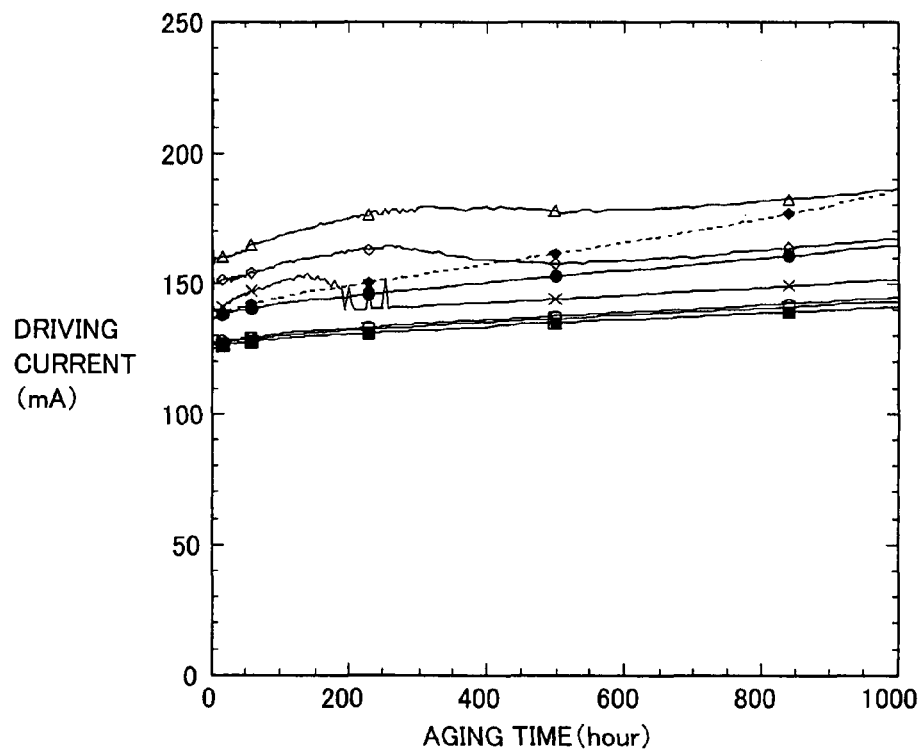
FIG. 12 shows a result of an aging test in high power drive for a nitride semiconductor laser device in accordance with a fourth embodiment.
Figure 13:
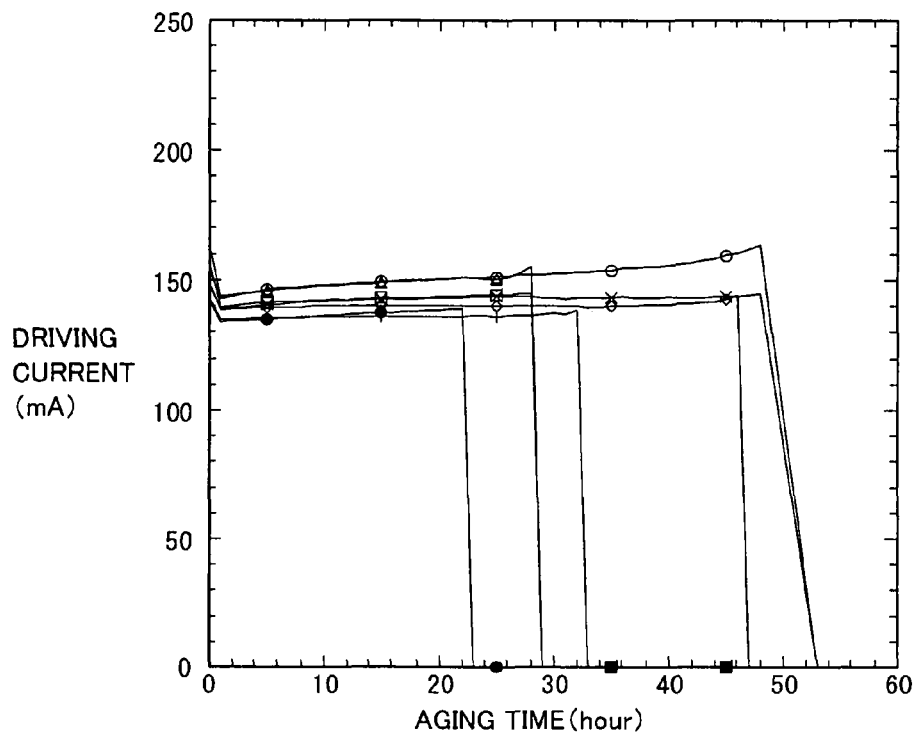
FIG. 13 shows a result of an aging test in high power drive for a conventional nitride semiconductor laser device.

For the nitride semiconductor laser device in the present embodiment, an aging test was conducted under the same method and the same conditions as the first embodiment. The result is shown in FIG. 12. As shown in FIG. 12, it was observed that all the eight nitride semiconductor laser devices in the present embodiment subjected to the aging test were driven without stopping laser light emission, even after 1000 hours passed, and it was found that long-term reliability at the time of high power drive could be improved.

It is noted that although in the foregoing description, reliability at the time of high power drive has been examined for a nitride semiconductor laser device, the result similar to the foregoing result can also be brought about when the first coat film and the second coat film as described above are formed on a light emitting surface as a light emitting portion of a nitride semiconductor diode device.

Fifth Embodiment

A nitride semiconductor laser device in the present embodiment has the similar configuration as the nitride semiconductor laser device in the first embodiment, except that the respective configurations of films formed on the facets at the light emitting side and the light reflecting side are changed.

Here, in the nitride semiconductor laser device in the present embodiment, an aluminum oxynitride film having a thickness of 20 nm is formed on the facet at the light emitting side, and an aluminum oxide film having a thickness of 150 nm is formed on the aluminum oxynitride film. Here, the reflectivity of the film formed on the facet at the light emitting side is 5%.

On the other hand, an aluminum oxynitride film having a thickness of 20 nm is formed on the facet at the light reflecting side, an aluminum oxynitride film having a thickness of 110 nm is formed on the aluminum oxynitride film, and four pairs of a silicon oxide film having a thickness of 71 nm and a titanium oxide film having a thickness of 46 nm are stacked on the aluminum oxynitride film (stacked starting from the silicon oxide film) and thereafter a silicon oxide film having a thickness of 142 nm is formed on the outermost surface. The reflectivity of the film formed on the facet at the light reflecting side is 95% or higher.

Here, each of the aluminum oxynitride film and the aluminum oxide film is formed by ECR sputtering.

Figure 14:
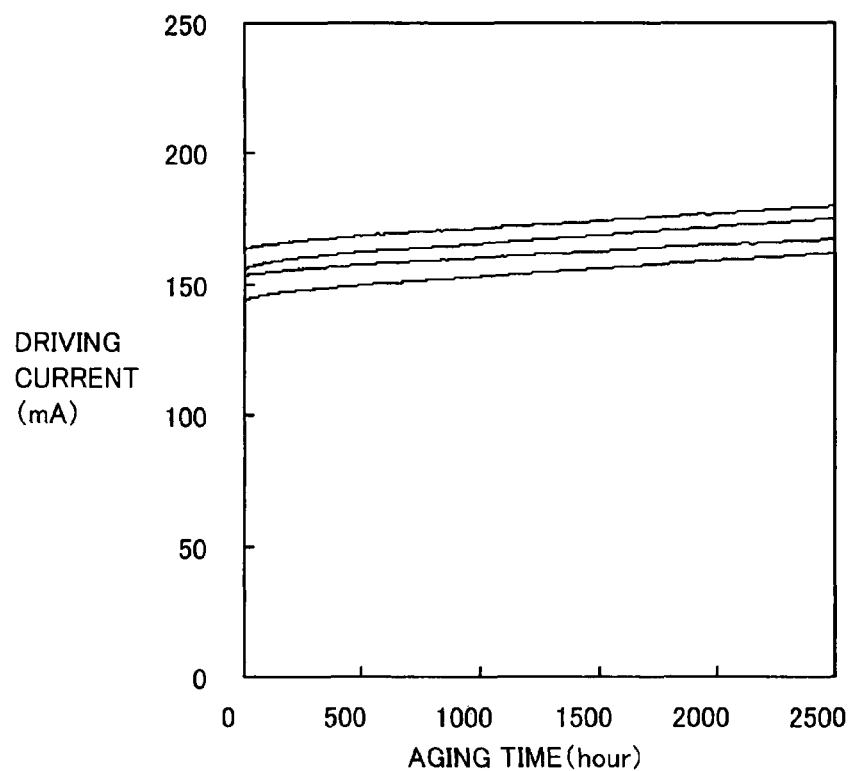
FIG. 14 shows a result of an aging test in high power drive for a nitride semiconductor laser device in accordance with a fifth embodiment.

An aging test was conducted similarly to the first embodiment in such a manner that the nitride semiconductor laser device in the present embodiment was allowed to continuously emit high-power laser light with an optical power of 100 mW with CW drive in a temperature environment of 70° C. The result is shown in FIG. 14. As shown in FIG. 14, it was observed that all the four nitride semiconductor laser devices in the present embodiment subjected to the aging test were driven without stopping laser light emission even after 2500 hours passed, and it was found that long-term reliability at the time of high power drive can be achieved.

In addition, the COD level was measured when the nitride semiconductor laser device in the present embodiment was allowed to continuously emit high-power laser light with an optical power of 100 mW for 500 hours with CW drive in a temperature environment of 70° C. As a result, the average COD level of five nitride semiconductor laser devices was 338 mW.

As described in the first embodiment, when the thickness of the aluminum oxide film on the aluminum oxynitride film on the facet at the light emitting side is 80 nm, the average COD level is 258 mW, when it is 160 nm, the average COD level is 340 mW, and when it is 240 nm, the average COD level is 346 mW. Therefore, it can be said that when the thickness of the aluminum oxide film on the aluminum oxynitride film on the facet at the light emitting side is 150 nm or thicker, long-term reliability at the time of high power drive can be improved greatly as compared with when it is 80 nm.

Sixth Embodiment

A nitride semiconductor laser device in the present embodiment has the similar configuration as the nitride semiconductor laser device in the first embodiment, except that the respective configurations of films formed on the facets at the light emitting side and the light reflecting side are changed.

Here, in the nitride semiconductor laser device in the present embodiment, an aluminum oxynitride film having a thickness of 20 nm is formed on the facet at the light emitting side, and an aluminum oxide film having a thickness of 130 nm is formed on the aluminum oxynitride film. Here, the reflectivity of the film formed on the facet at the light emitting side is 12.5%.

On the other hand, an aluminum oxynitride film having a thickness of 20 nm is formed on the facet at the light reflecting side, an aluminum oxynitride film having a thickness of 110 nm is formed on the aluminum oxynitride film, and four pairs of a silicon oxide film having a thickness of 71 nm and a titanium oxide film having a thickness of 46 nm are stacked on the aluminum oxynitride film (stacked starting from the silicon oxide film) and thereafter a silicon oxide film having a thickness of 142 nm is formed on the outermost surface. The reflectivity of the film formed on the facet at the light reflecting side is 95% or higher.

Here, each of the aluminum oxynitride film and the aluminum oxide film is formed by ECR sputtering.

Figure 15:
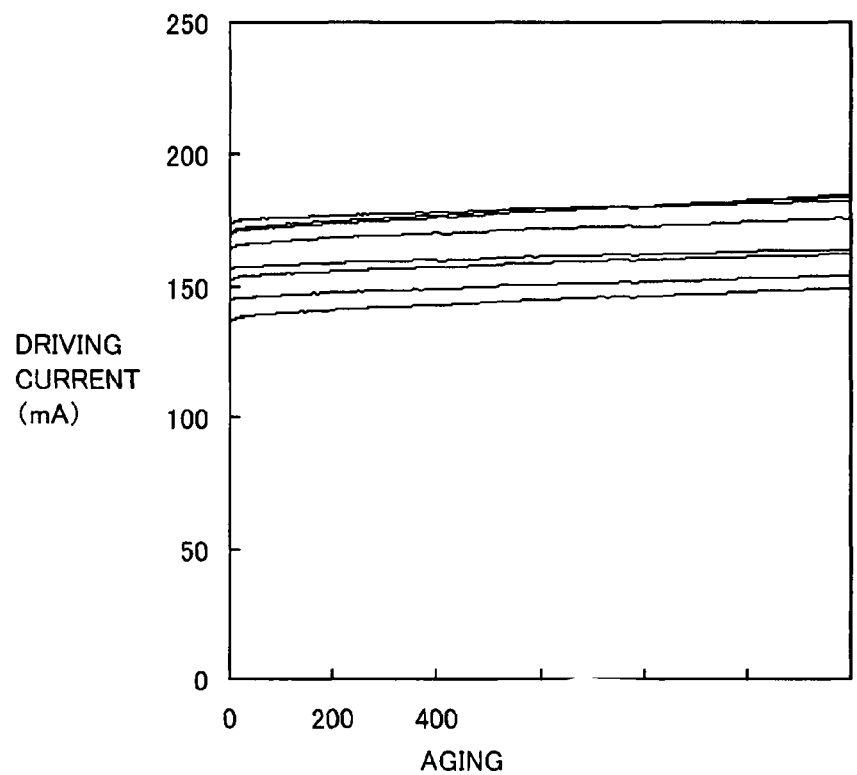
FIG. 15 shows a result of an aging test in high power drive for a nitride semiconductor laser device in accordance with a sixth embodiment.

An aging test was conducted similarly to the first embodiment in such a manner that the nitride semiconductor laser device in the present embodiment was allowed to continuously emit high-power laser light with an optical power of 100 mW with CW drive in a temperature environment of 70° C. The result is shown in FIG. 15. As shown in FIG. 15, it was observed that all the eight nitride semiconductor laser devices in the present embodiment subjected to the aging test were driven without stopping laser light emission even after 1200 hours passed, and it was found that long-term reliability at the time of high power drive can be achieved.

In addition, the COD level was measured when the nitride semiconductor laser device in the present embodiment was allowed to continuously emit high-power laser light with an optical power of 100 mW for 500 hours with CW drive in a temperature environment of 70° C. As a result, the average COD level of five nitride semiconductor laser devices was 320 mW.

As described in the first embodiment, when the thickness of the aluminum oxide film on the aluminum oxynitride film on the facet at the light emitting side is 80 nm, the average COD level is 258 mW, when it is 130 nm, the average COD level is 338 mW, when it is 160 nm, the average COD level is 340 mW, and when it is 240 nm, the average COD level is 346 mW. Therefore, it can be said that when the thickness of the aluminum oxide film on the aluminum oxynitride film on the facet at the light emitting side is 130 nm or thicker, long-term reliability at the time of high power drive can be improved greatly as compared with when it is 80 nm.

The present invention is applicable, for example, to a nitride semiconductor laser device emitting light having a wavelength in the ultraviolet to green region and a broad area type nitride semiconductor laser device for use in illumination with a stripe width of a few tens of μm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device including a first coat film of aluminum oxynitride formed at a light emitting portion and a second coat film of aluminum oxide formed on said first coat film, said second coat film having a thickness of at least 80 nm and at most 1000 nm, and wherein said first coat film has an oxygen content of at most 20 atomic %.

2. The nitride semiconductor light emitting device according to claim 1, wherein a thickness of said first coat film is at least 6 nm and at most 200 nm.

3. The nitride semiconductor light emitting device according to claim 1, wherein a thickness of said first coat film is at least 12 nm and at most 200 nm.

4. The nitride semiconductor light emitting device according to claim 1, wherein a thickness of said first coat film is at least 50 nm and at most 200 nm.

5. The nitride semiconductor light emitting device according to claim 1, wherein a thickness of said second coat film is at least 130 nm and at most 1000 nm.

6. The nitride semiconductor light emitting device according to claim 1, wherein a thickness of said second coat film is at least 150 nm and at most 1000 nm.

7. The nitride semiconductor light emitting device according to claim 1, wherein a thickness of said second coat film is at least 160 nm and at most 1000 nm.

* * * * *